United States Patent
Tsai et al.

(10) Patent No.: US 12,009,056 B2
(45) Date of Patent: Jun. 11, 2024

(54) DATA TRANSMISSION APPARATUS AND METHOD HAVING CLOCK GATING MECHANISM

(71) Applicant: REALTEK SEMICONDUCTOR CORPORATION, Hsinchu (TW)

(72) Inventors: Fu-Chin Tsai, Hsinchu (TW);
Ger-Chih Chou, Hsinchu (TW);
Chun-Chi Yu, Hsinchu (TW);
Chih-Wei Chang, Hsinchu (TW);
Shih-Han Lin, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 221 days.

(21) Appl. No.: 17/861,424

(22) Filed: Jul. 11, 2022

(65) Prior Publication Data
US 2024/0013824 A1  Jan. 11, 2024

(51) Int. Cl.
G11C 7/22 (2006.01)
G11C 7/10 (2006.01)

(52) U.S. Cl.
CPC ............ G11C 7/222 (2013.01); G11C 7/1012 (2013.01); G11C 7/109 (2013.01)

(58) Field of Classification Search
CPC ....... G11C 7/222; G11C 7/1012; G11C 7/109; G11C 7/1066; G11C 7/1072; G11C 7/1093; G06F 13/1689; G06F 13/4243
USPC .................................................. 365/233.1
See application file for complete search history.

(56) References Cited

U.S. PATENT DOCUMENTS

| | | | |
|---|---|---|---|
| 10,698,846 B2 * | 6/2020 | Chi | G06F 3/0604 |
| 2008/0046771 A1 * | 2/2008 | Hsu | G06F 1/10 |
| | | | 713/401 |
| 2009/0086874 A1 * | 4/2009 | Wang | H04L 7/005 |
| | | | 375/372 |
| 2019/0237127 A1 * | 8/2019 | Moon | G11C 7/222 |

* cited by examiner

*Primary Examiner* — Huan Hoang
*Assistant Examiner* — Minh Dinh
(74) *Attorney, Agent, or Firm* — WPAT, P.C

(57) ABSTRACT

The present invention discloses a data transmission apparatus having clock gating mechanism. Each of data transmission circuits has a flip-flop depth of N and receives a write clock signal and one of read clock signals to receive and output one of data signals. A write clock gating circuit receives a write clock gating enabling signal to transmit the write clock signal to the data transmission circuits. Each of read clock gating circuits receives one of read clock gating enabling signals to transmit one of the read clock signals. The gating signal transmission circuit has a flip-flop depth of N+M and receives the write and the read clock signals to receive the write clock gating enabling signal and output the read clock gating enabling signals. A largest timing difference among the read clock signals is P clock cycles and M is at least [P].

16 Claims, 7 Drawing Sheets

DATA TRANSMISSION APPARATUS AND METHOD HAVING CLOCK GATING MECHANISM

BACKGROUND OF THE INVENTION

1. Field of the Invention

The present invention relates to a data transmission apparatus and a data transmission method having clock gating mechanism.

2. Description of Related Art

Clock gating is a popular technique used in many synchronous circuits for reducing dynamic power dissipation, by removing the clock signal when the circuit is not in use. In a data transmission apparatus, the clock gating technology can be used to gate a write clock signal for performing write operation and a read clock signal for performing read operation.

However, when a plurality of data transmission circuits included in the data transmission apparatus and each of the data transmission circuits performs data transmission based on the clock signals in different time domains, the design of clock gating circuits becomes complex and may result in increased area and cost to the data transmission apparatus.

SUMMARY OF THE INVENTION

In consideration of the problem of the prior art, an object of the present invention is to supply a data transmission apparatus and a data transmission method having clock gating mechanism.

The present invention discloses a data transmission apparatus having clock gating mechanism that includes a plurality of data transmission circuits, a write clock gating circuit, a plurality of read clock gating circuits and a gating signal transmission circuit. Each of the plurality of data transmission circuits is configured to receive a write clock signal to receive one of a plurality of data signals accordingly and receive one of a plurality of read clock signals to output the corresponding one of the plurality of data signals. The write clock gating circuit is configured to receive a write clock gating enabling signal to enable and disable the transmission of the write clock signal to the data transmission circuits. Each of the plurality of read clock gating circuits is configured to receive one of a plurality of read clock gating enabling signals to enable and disable the transmission of one of the plurality of read clock signals to one of the data transmission circuits. The gating signal transmission circuit is configured to receive the write clock signal to receive the write clock gating enabling signal accordingly and receive the plurality of read clock signals to output the read clock gating enabling signals accordingly, wherein a depth of the gating signal transmission circuit is larger than a depth of each of the data transmission circuits at least by a predetermined number determined by a largest timing difference among the plurality of read clock signals.

The present invention also discloses a data transmission method having clock gating mechanism and used in a data transmission apparatus that includes steps outlined below. A write clock signal is received to receive one of a plurality of data signals accordingly and one of a plurality of read clock signals is received to output the corresponding one of the plurality of data signals by each of a plurality of data transmission circuits. A write clock gating enabling signal is received to enable and disable the transmission of the write clock signal to the data transmission circuits by a write clock gating circuit. One of a plurality of read clock gating enabling signals is received to enable and disable the transmission of one of the plurality of read clock signals to one of the data transmission circuits by each of a plurality of read clock gating circuits. The write clock signal is received to receive the write clock gating enabling signal accordingly and the plurality of read clock signals are received to output the read clock gating enabling signals accordingly by a gating signal transmission circuit, wherein a depth of the gating signal transmission circuit is larger than a depth of each of the data transmission circuits at least by a predetermined number determined by a largest timing difference among the plurality of read clock signals.

These and other objectives of the present invention will no doubt become obvious to those of ordinary skill in the art behind reading the following detailed description of the preferred embodiments that are illustrated in the various figures and drawings.

DETAILED DESCRIPTION OF THE PREFERRED EMBODIMENTS

An aspect of the present invention is to provide a data transmission apparatus and a data transmission method having clock gating mechanism that use a gating signal transmission circuit implemented by a single first-in-first-out circuit with additional flip-flops to provide additional timings so as to generate different read clock gating enabling signals according to read clock signals in different time domains to accomplish the gating of the read clock signals in different time domains. The area and the power of the data transmission apparatus can thus be greatly reduced.

Figure 1A:
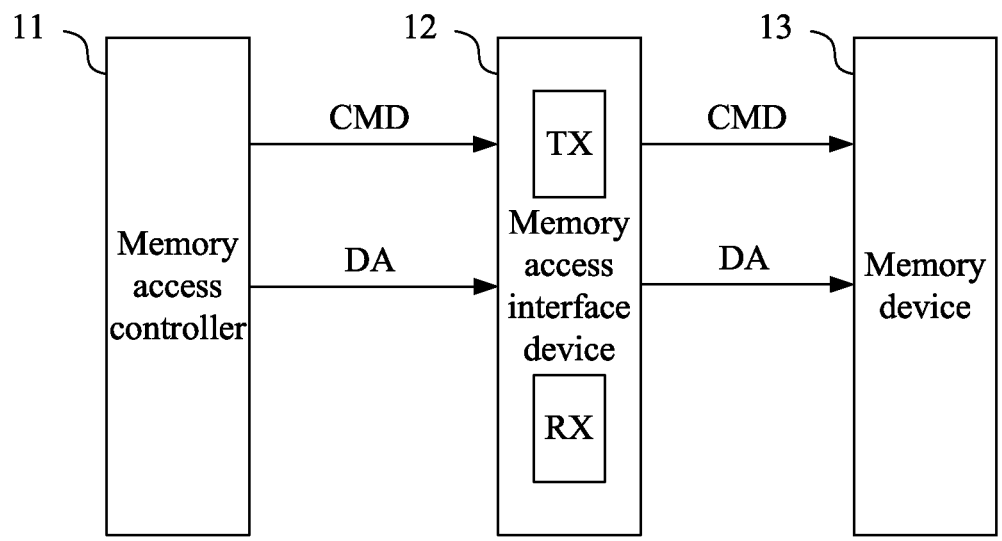
FIG. 1A illustrates a block diagram of a memory system 10 according to an embodiment of the present invention.

Reference is now made to FIG. 1A. FIG. 1A illustrates a block diagram of a memory system 10 according to an embodiment of the present invention. The memory system 10 includes a memory access controller 11, a memory access interface device 12 and a memory device 13.

The memory system 10 can be electrically coupled to other modules through such as, but not limited to a system bus (not illustrated). For example, the memory system 10 can be electrically coupled to a processor (not illustrated) through a system bus such that the processor can access the memory system 10.

In an embodiment, the memory access interface device 12 can be such as, but not limited to a physical layer circuit.

External access signals, e.g. the access signals including commands CMD and data signals DA from a processor, can be received by the memory access controller 11 first and can be transmitted to the memory access interface device 12. Further, the access signals can be either transmitted from the memory access interface device 12 to the memory device 13 or used as a reference within the memory access interface device 12 to access the memory device 13.

Figure 1B:
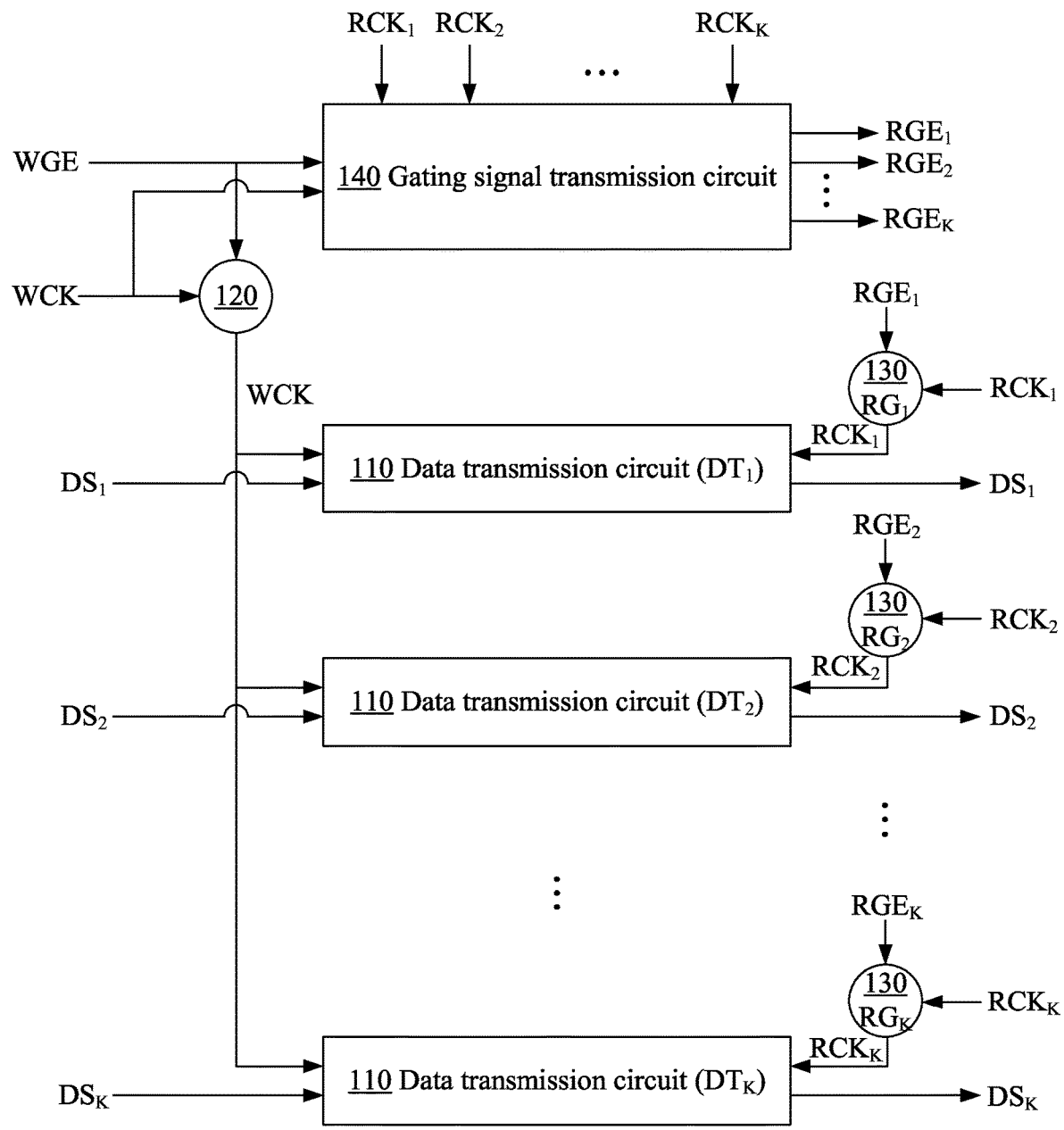
FIG. 1B illustrates a block diagram of a data transmission apparatus having clock gating mechanism according to an embodiment of the present invention.

FIG. 1B illustrates a block diagram of a data transmission apparatus 100 having clock gating mechanism according to an embodiment of the present invention.

In an embodiment, the data transmission apparatus 100 is disposed in the memory access interface device 12 in FIG. 1A. The data transmission apparatus 100 can be used to transmit the access signals described above. However, in other embodiments, the data transmission apparatus 100 can be used in other circuits. The present invention is not limited thereto.

The data transmission apparatus 100 includes a plurality of data transmission circuits 110, a write clock gating circuit 120, a plurality of read clock gating circuits 130 and a gating signal transmission circuit 140.

Figure 2:
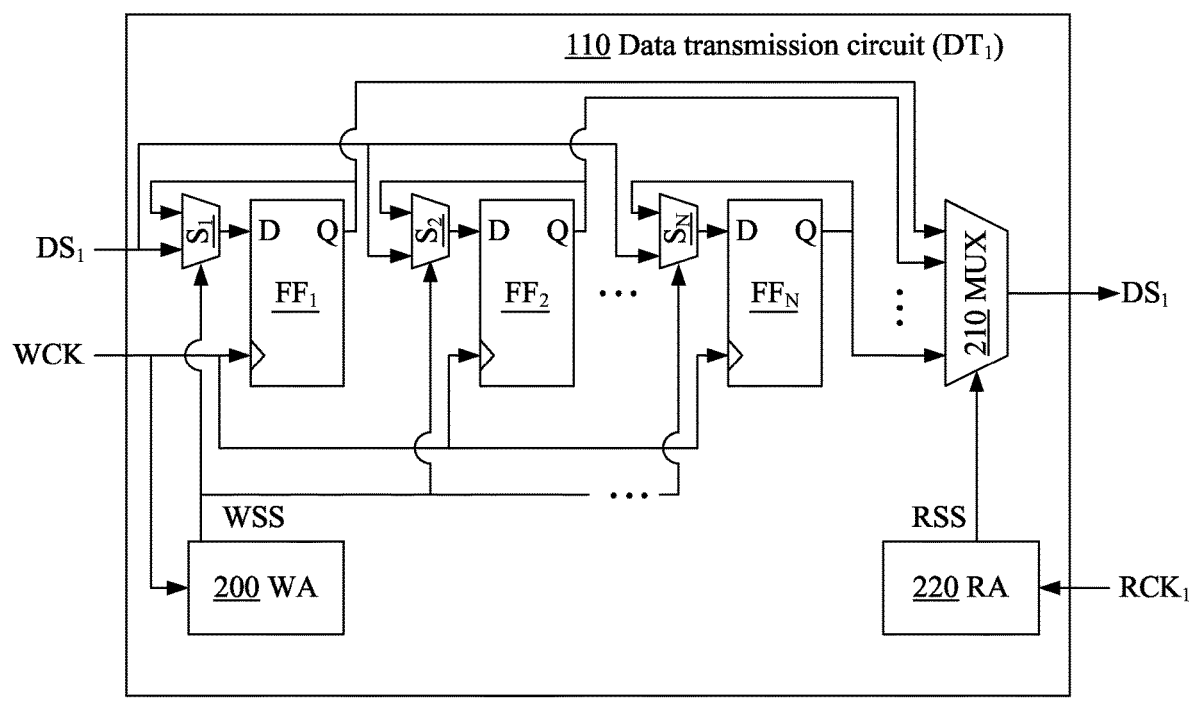
FIG. 2 illustrates a detailed block diagram of one of the data transmission circuits according to an embodiment of the present invention.

In an embodiment, the number of the data transmission circuits 110 is K, K being a positive integer, and the data transmission circuits 110 are labeled as $DT_1$~$DT_K$ in FIG. 2.

Each of the plurality of data transmission circuits 110 has a flip-flop depth of N, is operated in a first-in-first-out (FIFO) manner and is configured to receive a write clock signal WCK to receive one of a plurality of data signals $DS_1$~$DS_K$ accordingly and receive one of a plurality of read clock signals $RCK_1$~$RCK_K$ to output the corresponding one of the data signals $DS_1$~$DS_K$, N being a positive integer.

FIG. 2 illustrates a detailed block diagram of one of the data transmission circuits 110 according to an embodiment of the present invention. In FIG. 2, the data transmission circuit 110 labeled as $DT_1$ is exemplarily illustrated.

Each of the data transmission circuit 110 includes a plurality of flip-flops $FF_1$~$FF_N$, a write address generation circuit 200 (labeled as WA in FIG. 2), a multiplexer 210 (labeled as MUX in FIG. 2) and a read address generation circuit 220 (labeled as RA in FIG. 2).

The flip-flops $FF_1$~$FF_N$, have a number (i.e., the flip-flop depth) of N. In an embodiment, each of the flip-flops $FF_1$~$FF_N$ includes a data input port D, a data output port Q and a clock input port CK.

The write address generation circuit 200 is configured to receive the write clock signal WCK to select the flip-flops $FP_1$~$FF_N$ one after another to receive the corresponding one of the data signals $DS_1$~$DS_K$ based on the timing of the write clock signal WCK. For the data transmission circuit 110 labeled as $DT_1$, the data signal $DS_1$ is received.

In an embodiment, the write clock signal WCK is generated by a write clock source (not illustrated in the figure).

In an embodiment, the operation of the write address generation circuit 200 is similar to a counter to increment a number A from 1 to N according to the write clock signal WCK and further perform selection on the flip-flops $FF_1$~$FF_N$ from the first flip-flop $FF_1$ to the N-th flip-flop $FF_N$ according to the incremented number A by transmitting a selection signal WSS to the selected flip-flop.

The selected flip-flop thus receives a piece of data of the corresponding one of the data signals $DS_1$~$DS_K$ (which is the data signal $DS_1$ in the example illustrated in FIG. 2) from the data input port D based on the timing of the write clock signal WCK received from the clock input port CK.

In an embodiment, the data transmission circuit 110 further includes a plurality of selection units $S_1$~$S_N$ each corresponding to one of the flip-flops $FF_1$~$FF_N$ and configured to receive the selection signal WSS. Each of the selection units $S_1$~$S_N$, according to the status of the selection signal WSS, selects one of the data signal $DS_1$ and the signal fed back from the data output port Q of the corresponding to flip-flops $FF_1$~$FF_N$ to be fed to the data input port D of the corresponding to flip-flops $FF_1$~$FF_N$.

For example, when the flip-flop $FF_1$ is selected, the selection signal WSS controls the selection unit $S_1$ to select the data signal $DS_1$ to fed to the data input port D of the flip-flop $FF_1$. When the flip-flop $FF_2$ is not selected, the selection signal WSS controls the selection unit $S_2$ to select the signal fed back from the data output port Q of the flip-flop $FF_2$ to be fed to the data input port D of the flip-flop $FF_2$. The selection mechanism can be applied to other flip-flops and is not further described herein.

It is appreciated that the selection mechanism of the write address generation circuit 200 described above is merely an example. The present invention is not limited thereto.

The multiplexer 210 is coupled to all the flip-flops $FF_1$~$FF_N$. More specifically, the multiplexer 210 is coupled to the data output port Q of each of the flip-flops $FF_1$~$FF_N$.

The read address generation circuit 220 is configured to receive one of the plurality of read clock signals $RCK_1$~$RCK_K$ (which is the read clock signal $RCK_1$ in the example illustrated in FIG. 2), to control the multiplexer 210 to select the flip-flops $FF_1$~$FF_N$ one after another to receive the corresponding one of the data signals $DS_1$~$DS_K$ (which is the data signal $DS_1$ in the example illustrated in FIG. 2) therefrom and output the corresponding one of the data signals $DS_1$~$DS_K$.

In an embodiment, the read clock signals $RCK_1$~$RCK_K$ are generated from a plurality of read clock sources (not illustrated in the figure), in which the read clock signals $RCK_1$~$RCK_K$ have the same frequency (i.e., the same clock period) but are in either identical or different time domains. Namely, timing differences may exist among the read clock signals $RCK_1$~$RCK_K$, in which each of the timing differences can be measured by a number of clock cycles of these read clock signals $RCK_1$~$RCK_K$.

In an embodiment, the operation of the read address generation circuit 220 is similar to a counter to increment a number B from 1 to N according to one of the read clock signals $RCK_1$~$RCK_K$ (which is the read clock signal $RCK_1$ in the example illustrated in FIG. 2) and further perform selection on the flip-flops $FF_1$~$FF_N$ from the first flip-flop $FF_1$ to the N-th flip-flop $FF_N$ according to the incremented number B by transmitting a selection signal RSS to the multiplexer 210.

The multiplexer 210 enables an input port thereof coupled to the selected flip-flop, receives the data signal DS therefrom and outputs the data signal DS at an output port thereof.

It is appreciated that the selection mechanism of the read address generation circuit 220 described above is merely an example. The present invention is not limited thereto.

The data transmission circuit 110 labeled as $DT_2$~$DT_K$ may include a configuration identical to that of the data transmission circuit 110 labeled as $DT_1$. The detail is not described herein.

In FIG. 1B, the write clock gating circuit 120 is configured to receive a write clock gating enabling signal WGE to enable and disable the transmission of the write clock signal WCK to the data transmission circuits 110.

More specifically, the write clock gating enabling signal WGE may include two states that are either a high state or a low state. When the write clock gating enabling signal WGE is at a first one of the two states, the write clock gating circuit 120 is enabled to transmit the write clock signal WCK from the write clock source to the data transmission circuits 110 such that the data transmission circuits 110 receive the data signals $DS_1 \sim DS_K$ accordingly. When the write clock gating enabling signal WGE is at a second one of the two states, the write clock gating circuit 120 is disabled to stop transmitting the write clock signal WCK from the write clock source to the data transmission circuits 110 such that the data transmission circuits 110 do not receive the data signals $DS_1 \sim DS_K$.

Each of the plurality of read clock gating circuits 130, in which the read clock gating circuits 130 are labeled as $RG_1 \sim RG_K$, is configured to receive one of a plurality of read clock gating enabling signals $RGE_1 \sim RGE_K$ to enable and disable the transmission of one of the plurality of read clock signals $RCK_1 \sim RCK_K$ to one of the data transmission circuits 110.

More specifically, each of the read clock gating enabling signals $RGE_1 \sim RGE_K$ may include two states that are either a high state or a low state. Take the read clock gating enabling signal $RGE_1$ as an example, when the read clock gating enabling signal $RGE_1$ is at a first one of the two states, the read clock gating circuit 130 labeled as $RG_1$ is enabled to transmit the read clock signal $RCK_1$ from the corresponding read clock source to the data transmission circuits 110 such that the data transmission circuit 110 labeled as $DT_1$ outputs the data signal $DS_1$ accordingly. When the read clock gating enabling signal $RGE_1$ is at a second one of the two states, the read clock gating circuit 130 labeled as $RG_1$ is disabled to stop transmitting the read clock signal $RCK_1$ from the corresponding read clock source to the data transmission circuit 110 labeled as $DT_1$ such that the data transmission circuit 110 labeled as $DT_1$ does not output the data signal $DS_1$.

As a result, for the write operation, all the data transmission circuits 110 share the same write clock signal WCK, in which such a write clock signal WCK is enabled and disabled by the write clock gating enabling signal WGE. For the read operation, the data transmission circuits 110 receives different read clock signals $RCK_1 \sim RCK_K$ that may be in different time domains, in which each of the read clock signals $RCK_1 \sim RCK_K$ is enabled and disabled by a corresponding one of the read clock gating enabling signals $RGE_1 \sim RGE_K$.

The gating signal transmission circuit 140 has a flip-flop depth of N+M, is operated in the first-in-first-out manner, and is configured to receive the write clock signal WCK to receive the write clock gating enabling signal WGE accordingly and receive the plurality of read clock signals $RCK_1 \sim RCK_K$ to output the read clock gating enabling signals $RGE_1 \sim RGE_K$ accordingly, wherein a largest timing difference among the read clock signals $RCK_1 \sim RCK_K$ is P clock cycles thereof and M is at least $\lceil P \rceil$, in which $\lceil P \rceil$ is an integer ceiling function, M being a positive integer and P being a positive number.

Figure 3:
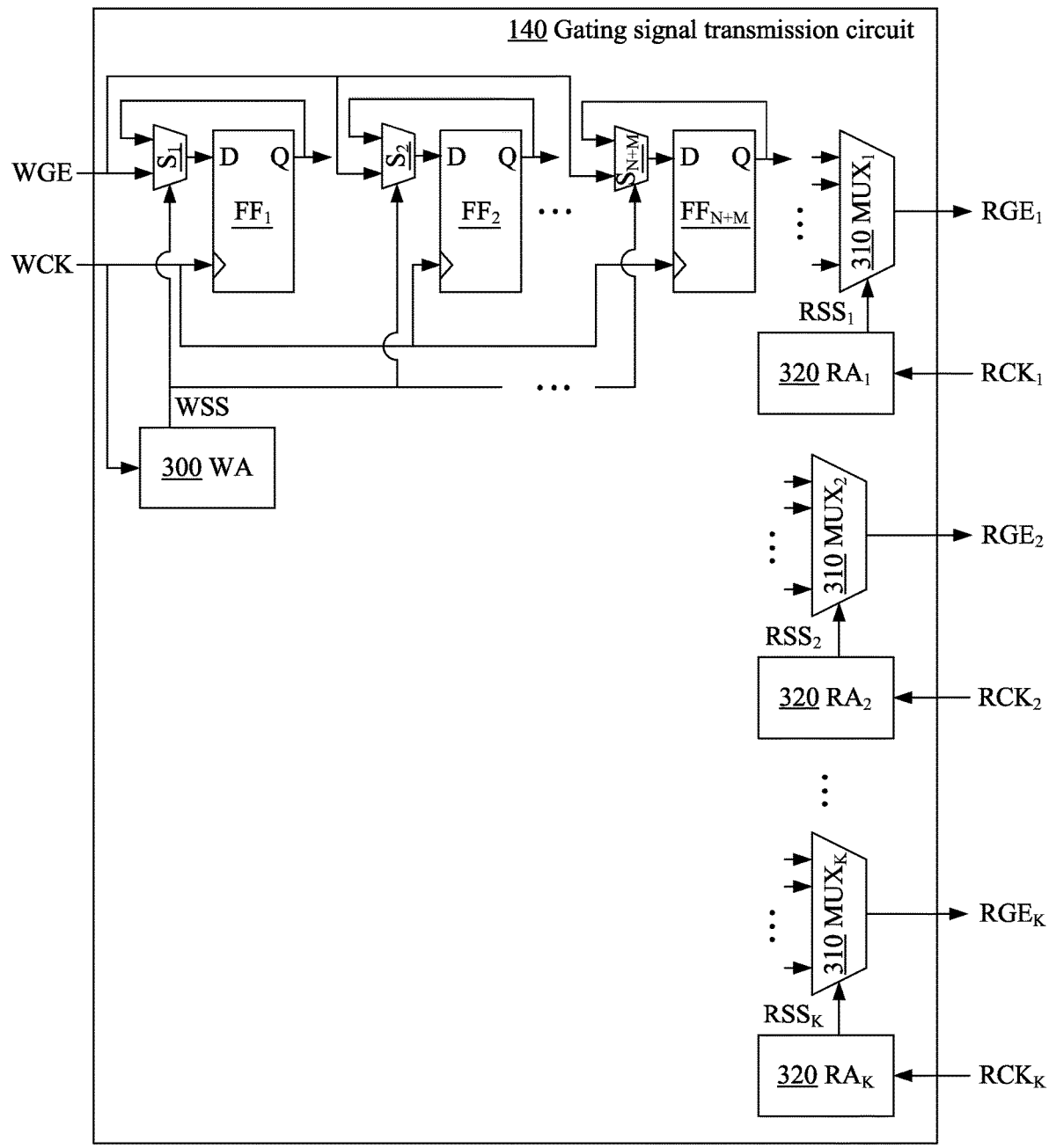
FIG. 3 illustrates a detailed block diagram of the gating signal transmission circuit according to an embodiment of the present invention.

Reference is now made to FIG. 3. FIG. 3 illustrates a detailed block diagram of the gating signal transmission circuit 140 according to an embodiment of the present invention.

The gating signal transmission circuit 140 includes a plurality of flip-flops $FF_1 \sim FF_{N+M}$, a write address generation circuit 300 (labeled as WA in FIG. 3), a plurality of multiplexers 310 (labeled as $MUX_1 \sim MUX_K$ in FIG. 3) and a plurality of read address generation circuits 320 (labeled as $RA_1 \sim RA_K$ in FIG. 3).

The flip-flops $FF_1 \sim FF_{N+M}$ have a number (i.e., the flip-flop depth) of N+M. In an embodiment, each of the flip-flops $FF_1 \sim FF_{N+M}$ includes a data input port D, a data output port Q and a clock input port CK.

The write address generation circuit 300 is configured to receive the write clock signal WCK to select the flip-flops $FF_1 \sim FF_{N+M}$ one after another to receive the write clock gating enabling signal WGE based on the timing of the write clock signal WCK.

The selection mechanism of the write address generation circuit 300 performed by using the selection signal WSS and the receiving mechanism of the selected flip-flop are identical to those of the write address generation circuit 200 and the flip-flop in FIG. 2. The detail is not described herein.

Each of the multiplexers 310 is coupled to all the flip-flops $FF_1 \sim FF_{N+M}$. More specifically, each of the multiplexers 310 is coupled to the data output port Q of each of the flip-flops $FF_1 \sim FF_{N+M}$. It is appreciated that in order to keep the figure simple, FIG. 3 does not illustrate actual connection between the multiplexers 310 and the flip-flops $FF_1 \sim FF_{N+M}$. However, each of the multiplexers 310 can be coupled to the flip-flops $FF_1 \sim FF_{N+M}$ in the same manner as the configuration of the multiplexer 210 coupled to the flip-flops $FF_1 \sim FF_N$ illustrated in FIG. 2.

Each of the read address generation circuits 320 is configured to receive one of the plurality of read clock signals $RCK_1 \sim RCK_K$, to control a corresponding one of the multiplexers 310 to select the flip-flops $FF_1 \sim FF_{N+M}$ one after another to receive the write clock gating enabling signal WGE therefrom and output the write clock gating enabling signal WGE as one of the read clock gating enabling signals $RGE_1 \sim RGE_K$. Each of the read clock gating enabling signals $RGE_1 \sim RGE_K$ are further transmitted to one of the read clock gating circuits 130 illustrated in FIG. 1B.

The selection mechanism of each of the read address generation circuits 320 performed by using one of the selection signals $RSS_1 \sim RSS_K$ and the outputting mechanism of each of the multiplexers 310 are identical to those of the read address generation circuit 220 and the multiplexer 210 in FIG. 2. The detail is not described herein.

In order to accomplish an elastic data transmission mechanism, the time domains of the read clock signals $RCK_1 \sim RCK_K$ are allowed to be different such that the corresponding data signals $DS_1 \sim DS_K$ can be transmitted with different timings that are adjustable according to the requirements.

As a result, timing differences exist among the read clock signals $RCK_1 \sim RCK_K$, in which the largest timing difference among the read clock signals $RCK_1 \sim RCK_K$ is P clock cycles thereof. More specifically, the largest timing difference is the timing difference between the read clock signal having the earliest timing and the read clock signal having the latest timing.

In order to provide the read clock signal gating mechanism that matches the timing of the read clock signals $RCK_1 \sim RCK_K$, the gating signal transmission circuit 140 includes the flip-flops $FF_1 \sim FF_{N+M}$ having the number of N+M, M being at least $\lceil P \rceil$, in which $\lceil P \rceil$ is an integer ceiling function.

For example, if the largest timing difference among the read clock signals $RCK_1 \sim RCK_K$ is 1.25 clock cycles of these read clock signals, $\lceil 1.25 \rceil=2$ such that the number of the flip-flops in the gating signal transmission circuit 140 is at least N+2.

As a result, the additional flip-flops having the number of M in the gating signal transmission circuit 140 (compared with the number of the flip-flops in each of the data transmission circuits 110) provides additional timing that generate the read clock gating enabling signals $RGE_1 \sim RGE_K$ allowing all of the read clock signals $RCK_1 \sim RCK_K$, including the read clock signal having the latest timing, to be gated correctly according to respective timings thereof.

Further, the data signals $DS_1 \sim DS_K$ can be outputted by the data transmission circuits 110 with the correct timing according to the read clock signals $RCK_1 \sim RCK_K$ transmitted through the read clock gating circuits 130 under the control of the read clock gating enabling signals $RGE_1 \sim RGE_K$.

Figure 4:
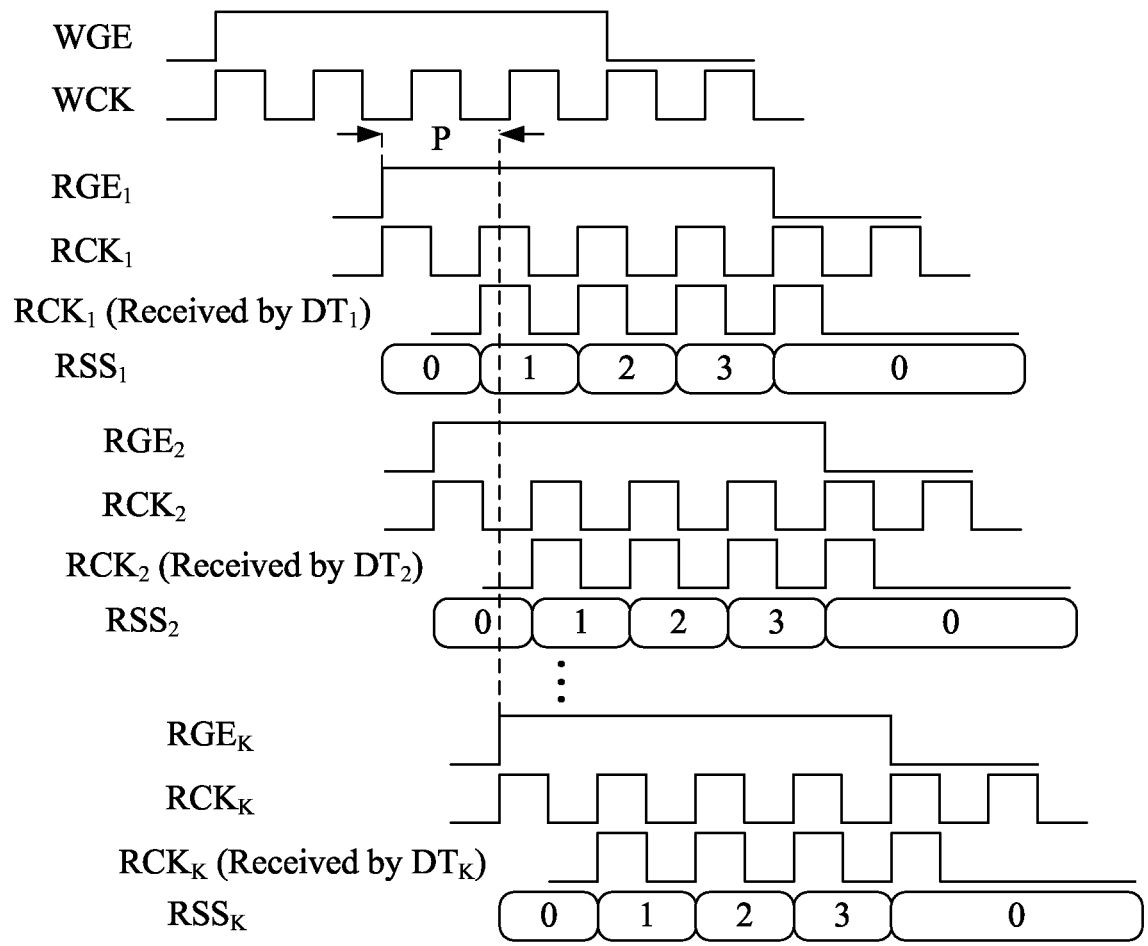
FIG. 4 illustrates a waveform diagram of various signals related to the operation of the data transmission circuits according to an embodiment of the present invention.
Figure 5:
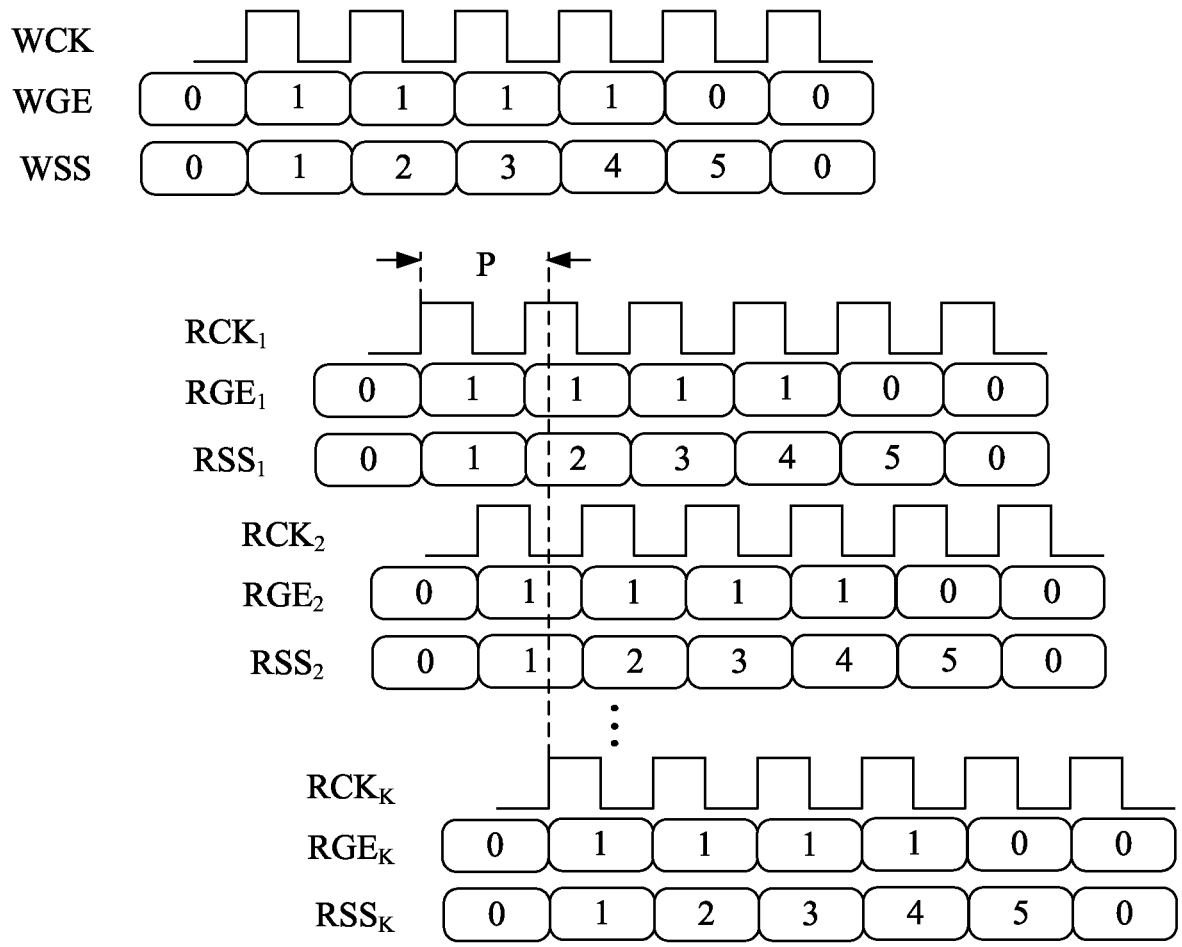
FIG. 5 illustrates a waveform diagram of various signals related to the operation of the gating signal transmission circuit according to an embodiment of the present invention.

Reference is now made to FIG. 4 and FIG. 5 at the same time. FIG. 4 illustrates a waveform diagram of various signals related to the operation of the data transmission circuits 110 according to an embodiment of the present invention. FIG. 5 illustrates a waveform diagram of various signals related to the operation of the gating signal transmission circuit 140 according to an embodiment of the present invention.

In FIG. 4, an enable section of the write clock gating enabling signal WGE, which is a high state section, controls the write clock gating circuit 120 to transmit four clock cycles of the write clock signal WCK to each of the data transmission circuits 110 labeled as $DT_1 \sim DT_K$.

Similarly, an enable section of each of the read clock gating enabling signals $RGE_1 \sim RGE_K$, which is a high state section, controls each of the read clock gating circuits 130 to transmit four clock cycles of the read clock signals $RCK_1 \sim RCK_K$ to each of the data transmission circuits 110 labeled as $DT_1 \sim DT_K$. Each of the data signals $DS_1 \sim DS_K$ having four pieces of data labeled as 0~3 is outputted by the flip-flops in the data transmission circuits 110 labeled as $DT_1 \sim DT_K$, in which the number of the flip-flops is four (N=4) to receive and output the four pieces of data.

Due to the operation of the gating signal transmission circuit 140, a timing difference is presented between the write clock gating enabling signal WGE and the read clock gating enabling signal having the earliest timing, which is the read clock gating enabling signal $RGE_1$ in the present embodiment.

Moreover, since the read clock signals $RCK_1 \sim RCK_K$ are in different time domains, timing differences are also presented among the read clock gating enabling signal $RGE_1 \sim RGE_K$, in which the read clock gating enabling signal $RGE_K$ has the latest timing in the present embodiment. As illustrated in FIG. 4, the timing difference between the read clock gating enabling signals $RGE_1$ respectively having the earliest and the latest timing is P, which is 1.25 clock cycles of the read clock signals $RCK_1 \sim RCK_K$.

As a result, six flip-flops (N+M=4+$\lceil 1.25 \rceil$=4+2=6) can be disposed in the gating signal transmission circuit 140 such that the write address generation circuit 300 generates the selection signal WSS having six clock cycles labeled as 0~5 in FIG. 5 to allow the six flip-flops to receive six clock cycles of write clock gating enabling signal WGE according to the write clock signal WCK.

The first four clock cycles of the write clock gating enabling signal WGE, each labeled as 1, correspond to the enabling section. The rest two clock cycles of the write clock gating enabling signal WGE, each labeled as 0, are used to provide additional timing for the read clock signals $RCK_1 \sim RCK_K$, which is sufficient for the timing difference P illustrated in FIG. 5.

Each of the read address generation circuits 320 generates one of the selection signals $RSS_1 \sim RSS_K$ having six clock cycles labeled as 0~5 in FIG. 5 to allow one of the multiplexers 310 to output one of the read clock gating enabling signals $RGE_1 \sim RGE_K$ from the six flip-flops according to one of the read clock signals $RCK_1 \sim RCK_K$.

The first four clock cycles of each of the read clock gating enabling signals $RGE_1 \sim RGE_K$, each labeled as 1, correspond to the enabling section. The rest two clock cycles of each of the read clock gating enabling signals $RGE_1 \sim RGE_K$, each labeled as 0, are used to disable the transmission of one of the read clock signals $RCK_1 \sim RCK_K$.

In some approaches, the data transmission apparatus disposes a plurality of gating signal transmission circuits each including a first-in-first-out circuit to generate different read clock gating enabling signals to provide the gating mechanism to the read clock signals in different time domains. Such a configuration is area-consuming and power-consuming.

As a result, the data transmission apparatus of the present invention uses a gating signal transmission circuit implemented by a single first-in-first-out circuit with additional flip-flops to provide additional timings so as to generate different read clock gating enabling signals according to read clock signals in different time domains to accomplish the gating of the read clock signals in different time domains. The area and the power of the data transmission apparatus can thus be greatly reduced.

It is appreciated that in the embodiment described above, M equals to $\lceil P \rceil$. However, when a delay condition occurs in the signal transmission among the circuits, the additional timing provided by the additional flip-flops may be not enough. In order to guarantee the timing is sufficient, M can be larger than $\lceil P \rceil$ to disposed further additional flip-flops in the gating signal transmission circuit.

Moreover, in the embodiment described above, each of the read clock signals $RCK_1 \sim RCK_K$ has a read frequency and the write clock signal WCK has a write frequency, and a frequency ratio between the read frequency and the write frequency is 1 such that a data writing speed and a data reading speed of each of the data transmission circuits 110 are the same.

However, in other embodiments, each of the read clock signals has a read frequency and the write clock signal has a write frequency, and a frequency ratio between the read frequency and the write frequency is F such that a data reading speed of each of the data transmission circuits is F times of a data writing speed of each of the data transmission circuits, and a unit data reading amount of each of the data transmission circuits is 1/F times of a unit data writing amount of each of the data transmission circuits. The configuration of the data transmission apparatus 100 can be applied to the condition that the data reading speed and the data writing speed of each of the data transmission circuits are different.

Figure 6:
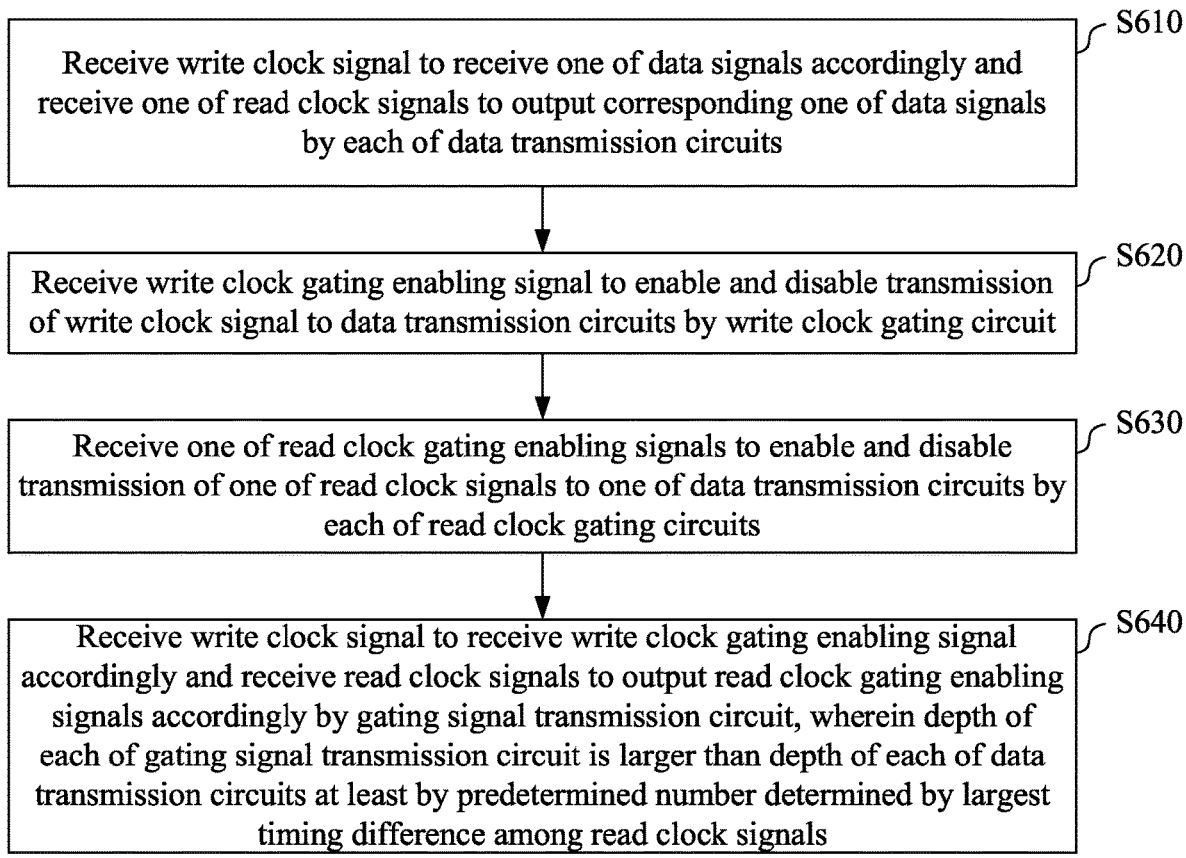
FIG. 6 illustrates a flow chart of a data transmission method having clock gating mechanism according to an embodiment of the present invention.

Reference is now made to FIG. 6. FIG. 6 illustrates a flow chart of a data transmission method 600 having clock gating mechanism according to an embodiment of the present invention.

In addition to the apparatus described above, the present disclosure further provides the data transmission method 600 having clock gating mechanism that can be used in such as, but not limited to, the data transmission apparatus 100 in FIG. 1B. As illustrated in FIG. 6, an embodiment of the data transmission method 600 includes the following steps.

In step S610, the write clock signal WCK is received to receive one of the data signals $DS_1$~$DS_K$ accordingly and one of the read clock signals $RCK_1$~$RCK_K$ is received to output the corresponding one of the data signals $DS_1$~$DS_K$ by each of the data transmission circuits 110.

In step S620, the write clock gating enabling signal WGE is received to enable and disable the transmission of the write clock signal WCK to the data transmission circuits 100 by the write clock gating circuit 120.

In step S630, one of the read clock gating enabling signals $RGE_1$~$RGE_K$ is received to enable and disable the transmission of one of the read clock signals $RCK_1$~$RCK_K$ to one of the data transmission circuits 110 by each of the read clock gating circuits 130.

In step S640, the write clock signal WCK is received to receive the write clock gating enabling signal WGE accordingly and the read clock signals $RCK_1$~$RCK_K$ are received to output the read clock gating enabling signals $RGE_1$~$RGE_K$ accordingly by the gating signal transmission circuit 140, wherein the depth of each of the gating signal transmission circuit 140 is larger than the depth of each of the data transmission circuits 110 at least by a predetermined number determined by a largest timing difference among the read clock signals $RCK_1$~$RCK_K$.

It is appreciated that the embodiments described above are merely an example. In other embodiments, it should be appreciated that many modifications and changes may be made by those of ordinary skill in the art without departing, from the spirit of the disclosure.

In summary, the present invention discloses the data transmission apparatus and the data transmission method having clock gating mechanism use a gating signal transmission circuit implemented by a single first-in-first-out circuit with additional flip-flops to provide additional timings so as to generate different read clock gating enabling signals according to read clock signals in different time domains to accomplish the gating of the read clock signals in different time domains. The area and the power of the data transmission apparatus can thus be greatly reduced.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A data transmission apparatus having clock gating mechanism, comprising:
   a plurality of data transmission circuits each configured to receive a write clock signal to receive one of a plurality of data signals accordingly and receive one of a plurality of read clock signals to output the corresponding one of the plurality of data signals accordingly;
   a write clock gating circuit configured to receive a write clock gating enabling signal to enable and disable the transmission of the write clock signal to the data transmission circuits;
   a plurality of read clock gating circuits each configured to receive one of a plurality of read clock gating enabling signals to enable and disable the transmission of one of the plurality of read clock signals to one of the data transmission circuits; and
   a gating signal transmission circuit configured to receive the write clock signal to receive the write clock gating enabling signal accordingly and receive the plurality of read clock signals to output the read clock gating enabling signals accordingly, wherein a depth of the gating signal transmission circuit is larger than a depth of each of the data transmission circuits at least by a predetermined number determined by a largest timing difference among the plurality of read clock signals.

2. The data transmission apparatus of claim 1, wherein each of the data transmission circuits has a flip-flop depth of N and operated in a first-in-first-out (FIFO) manner, and each of the gating signal transmission circuit has the flip-flop depth of N+M and operated in the FIFO manner;
   the largest timing difference among the plurality of read clock signals is P clock cycles thereof and M is at least ⌈P⌉, N and M being a positive integer and P being a positive number.

3. The data transmission apparatus of claim 2, wherein each of the data transmission circuits comprises:
   a plurality of flip-flops having a number of N;
   a write address generation circuit configured to receive the write clock signal to select the flip-flops one after another to receive the corresponding one of the plurality of data signals based on the timing of the write clock signal;
   a multiplexer coupled to all the flip-flops; and
   a read address generation circuit configured to receive one of the plurality of read clock signals to control the multiplexer to select the flip-flops one after another to receive the corresponding one of the plurality of data signals therefrom and output the corresponding one of the plurality of data signals.

4. The data transmission apparatus of claim 2, wherein the gating signal transmission circuit comprises:
   a plurality of flip-flops having a number of N+M;
   a write address generation circuit configured to receive the write clock signal to select the flip-flops one after another to receive the write clock gating enabling signal based on the timing of the write clock signal;
   a plurality of multiplexers each coupled to all the flip-flops; and
   a plurality of read address generation circuits each configured to receive one of the plurality of read clock signals to control a corresponding one of the multiplexers to select the flip-flops one after another to receive the write clock gating enabling signal therefrom and output the write clock gating enabling signal as one of the read clock gating enabling signals.

5. The data transmission apparatus of claim 2, wherein M is larger than ⌈P⌉.

6. The data transmission apparatus of claim 1, wherein each of the read clock signals has a read frequency and the write clock signal has a write frequency, and a frequency ratio between the read frequency and the write frequency is 1 such that a data writing speed and a data reading speed of each of the data transmission circuits are the same.

7. The data transmission apparatus of claim 1, wherein each of the read clock signals has a read frequency and the write clock signal has a write frequency, and a frequency ratio between the read frequency and the write frequency is F such that a data reading speed of each of the data transmission circuits is F times of a data writing speed of each of the data transmission circuits, and a unit data reading amount of each of the data transmission circuits is 1/F times of a unit data writing amount of each of the data transmission circuits.

8. The data transmission apparatus of claim 1, wherein the data transmission apparatus is disposed in a memory access interface device which disposed between a memory controller and a memory device.

9. A data transmission method having clock gating mechanism and used in a data transmission apparatus, comprising:
   receiving a write clock signal to receive one of a plurality of data signals accordingly and receiving one of a plurality of read clock signals to output the corresponding one of the plurality of data signals accordingly by each of a plurality of data transmission circuits;
   receiving a write clock gating enabling signal to enable and disable the transmission of the write clock signal to the data transmission circuits by a write clock gating circuit;
   receiving one of a plurality of read clock gating enabling signals to enable and disable the transmission of one of the plurality of read clock signals to one of the data transmission circuits by each of a plurality of read clock gating circuits; and
   receiving the write clock signal to receive the write clock gating enabling signal accordingly and receiving the plurality of read clock signals to output the read clock gating enabling signals accordingly by a gating signal transmission circuit, wherein a depth of the gating signal transmission circuit is larger than a depth of each of the data transmission circuits at least by a predetermined number determined by a largest timing difference among the plurality of read clock signals.

10. The data transmission method of claim 9, wherein each of the data transmission circuits has a flip-flop depth of N and operated in a FIFO manner, and each of the gating signal transmission circuit has the flip-flop depth of N+M and operated in the FIFO manner;
   the largest timing difference among the plurality of read clock signals is P clock cycles thereof and M is at least [P], N and M being a positive integer and P being a positive number.

11. The data transmission method of claim 10, for each of the data transmission circuits, the data transmission method further comprises:
   receiving the write clock signal by a write address generation circuit to select a plurality of flip-flops having a number of N one after another to receive the corresponding one of the plurality of data signals based on the timing of the write clock signal; and
   receiving one of the plurality of read clock signals by a read address generation circuit to control a multiplexer coupled to all the flip-flops to select the flip-flops one after another to receive the corresponding one of the plurality of data signals therefrom and output the corresponding one of the plurality of data signals.

12. The data transmission method of claim 10, further comprising:
   receiving the write clock signal by a write address generation circuit of the gating signal transmission circuit to select a plurality of flip-flops of the gating signal transmission circuit having a number of N+M one after another to receive the write clock gating enabling signal based on the timing of the write clock signal; and
   receiving one of the plurality of read clock signals by each of a plurality of read address generation circuits to control a corresponding one of a plurality of multiplexers each coupled to all the flip-flops to select the flip-flops one after another to receive the write clock gating enabling signal therefrom and output the write clock gating enabling signal as one of the read clock gating enabling signals.

13. The data transmission method of claim 10, wherein M is larger than [P].

14. The data transmission method of claim 9, wherein each of the read clock signals has a read frequency and the write clock signal has a write frequency, and a frequency ratio between the read frequency and the write frequency is 1 such that a data writing speed and a data reading speed of each of the data transmission circuits are the same.

15. The data transmission method of claim 9, wherein each of the read clock signals has a read frequency and the write clock signal has a write frequency, and a frequency ratio between the read frequency and the write frequency is F such that a data reading speed of each of the data transmission circuits is F times of a data writing speed of each of the data transmission circuits, and a unit data reading amount of each of the data transmission circuits is 1/F times of a unit data writing amount of each of the data transmission circuits.

16. The data transmission method of claim 9, wherein the data transmission apparatus is disposed in a memory access interface device which disposed between a memory controller and a memory device.

* * * * *